(12) United States Patent
Ting et al.

(10) Patent No.: US 11,776,920 B2
(45) Date of Patent: Oct. 3, 2023

(54) CAPACITOR AND FILTER AND REDISTRIBUTION LAYER STRUCTURE INCLUDING THE SAME

(71) Applicant: Industrial Technology Research Institute, Hsinchu (TW)

(72) Inventors: Tzu-Yang Ting, Taipei (TW); Chieh-Wei Feng, Taoyuan (TW); Tai-Jui Wang, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 270 days.

(21) Appl. No.: 17/158,014

(22) Filed: Jan. 26, 2021

(65) Prior Publication Data
US 2022/0173055 A1 Jun. 2, 2022

(30) Foreign Application Priority Data
Nov. 27, 2020 (TW) ................................ 109141910

(51) Int. Cl.
*H01L 23/64* (2006.01)
*H01L 23/498* (2006.01)
(Continued)

(52) U.S. Cl.
CPC ........... *H01L 23/642* (2013.01); *H01F 27/40* (2013.01); *H01G 4/012* (2013.01); *H01G 4/30* (2013.01);
(Continued)

(58) Field of Classification Search
CPC ..... H01L 23/64; H01L 23/498; H01L 23/552; H01L 23/642–645; H01G 4/012; H01G 4/002; H01G 4/30; H01G 4/40
(Continued)

(56) References Cited

U.S. PATENT DOCUMENTS

| 5,945,892 A | 8/1999 | Kato et al. |
| 6,407,904 B1 | 6/2002 | Kuroda et al. |
| 7,791,896 B1 * | 9/2010 | Fan ........................ H05K 1/185 361/765 |
| 10,629,378 B2 * | 4/2020 | Lee ........................ H01G 4/232 |

(Continued)

FOREIGN PATENT DOCUMENTS

| CN | 101310347 | 11/2008 |
| CN | 202008926 | 10/2011 |
| TW | I382433 | 1/2013 |

OTHER PUBLICATIONS

"Office Action of Taiwan Counterpart Application", dated Dec. 2, 2021, p. 1-p. 10.

*Primary Examiner* — Tuan T Dinh
(74) *Attorney, Agent, or Firm* — JCIPRNET

(57) ABSTRACT

Provided a filter and a redistribution layer structure including the same. The capacitor includes a first electrode, a second electrode, a third electrode, a dielectric layer, and a conductive through via. The second electrode is disposed above the first electrode. The third electrode is disposed between the first electrode and the second electrode. The dielectric layer is disposed between the first electrode and the third electrode and between the second electrode and the third electrode. The conductive through via penetrates the dielectric layer and the third electrode to be connected to the first electrode and the second electrode, and is electrically separated from the third electrode. The first electrode and the second electrode are signal electrodes, and the third electrode is a ground electrode.

14 Claims, 7 Drawing Sheets

(51) Int. Cl.
*H01L 49/02* (2006.01)
*H03H 7/01* (2006.01)
*H01G 4/30* (2006.01)
*H01G 4/012* (2006.01)
*H01G 4/40* (2006.01)
*H01F 27/40* (2006.01)
*H01L 23/552* (2006.01)

(52) U.S. Cl.
CPC ......... *H01G 4/40* (2013.01); *H01L 23/49822* (2013.01); *H01L 23/552* (2013.01); *H01L 23/645* (2013.01); *H01L 28/60* (2013.01); *H03H 7/0115* (2013.01)

(58) Field of Classification Search
USPC ........... 361/764–766, 784, 803, 300; 333/25, 333/158, 85, 204
See application file for complete search history.

(56) References Cited

U.S. PATENT DOCUMENTS

| | | | |
|---|---|---|---|
| 2002/0015293 A1* | 2/2002 | Akiba | H01L 25/16 257/E23.114 |
| 2008/0055019 A1 | 3/2008 | Togashi | |
| 2010/0194498 A1* | 8/2010 | Isoshima | H01P 1/20345 29/846 |
| 2015/0041198 A1* | 2/2015 | Lee | H01G 2/06 361/301.4 |
| 2015/0287549 A1* | 10/2015 | Park | H01G 4/005 361/270 |
| 2017/0290143 A1* | 10/2017 | Ito | H03H 7/0115 |
| 2017/0338789 A1* | 11/2017 | Mukai | H03H 7/1758 |
| 2018/0351529 A1* | 12/2018 | Miyahara | H01G 4/40 |
| 2019/0148047 A1 | 5/2019 | Asano et al. | |
| 2019/0260343 A1* | 8/2019 | Shiokawa | H01F 27/00 |
| 2020/0239371 A1* | 7/2020 | Pfeiffenberger | C04B 35/495 |

\* cited by examiner

CAPACITOR AND FILTER AND REDISTRIBUTION LAYER STRUCTURE INCLUDING THE SAME

CROSS-REFERENCE TO RELATED APPLICATION

This application claims the priority benefit of Taiwan application serial no. 109141910, filed on Nov. 27, 2020. The entirety of the above-mentioned patent application is hereby incorporated by reference herein.

TECHNICAL FIELD

The disclosure relates to a capacitor and a filter and a redistribution layer (RDL) structure including the same.

BACKGROUND

In embedded passive component techniques, the capacitive component continues to receive attention. However, the parasitic effect of the capacitive component causes the capacitance value to show a non-linear change, and causes the self-resonant frequency (SRF) of the capacitive component to drop. Therefore, the application frequency range of the capacitive component is limited.

In detail, when the operating frequency is less than the self-resonant frequency, the operating characteristic of the capacitive component is capacitance, and when the operating frequency is greater than the self-resonant frequency, the operating characteristic of the capacitive component is similar to that of inductance. Generally speaking, the greater the size of the capacitor, the greater the parasitic effect, thus resulting in reduced self-resonant frequency, and as a result the capacitance application range of the capacitor is smaller. In particular, during high-frequency operation, the self-resonant frequency of the capacitive component is very susceptible to influence, causing the capacitance value to deviate significantly from the original design, and thus causing electrical abnormalities in products (such as LC filters).

SUMMARY

An embodiment of the disclosure provides a capacitor having two layers of signal electrodes and a layer of a ground electrode located in between.

An embodiment of the disclosure provides a filter including a capacitor, and the capacitor has two layers of signal electrodes and a layer of a ground electrode in between.

An embodiment of the disclosure provides a redistribution layer structure including a capacitor, and the capacitor has two layers of signal electrodes and a layer of a ground electrode in between.

The capacitor of an embodiment of the disclosure includes a first electrode, a second electrode, a third electrode, a dielectric layer, and a conductive through via. The second electrode is disposed above the first electrode. The third electrode is disposed between the first electrode and the second electrode. The dielectric layer is disposed between the first electrode and the third electrode and between the second electrode and the third electrode. The conductive through via penetrates the dielectric layer and the third electrode to be connected to the first electrode and the second electrode, and is electrically separated from the third electrode. The first electrode and the second electrode are signal electrodes, and the third electrode is a ground electrode.

The filter of an embodiment of the disclosure includes a capacitor and an inductor. The capacitor includes a first electrode, a second electrode, a third electrode, a dielectric layer, and a conductive through via. The second electrode is disposed above the first electrode. The third electrode is disposed between the first electrode and the second electrode. The dielectric layer is disposed between the first electrode and the third electrode and between the second electrode and the third electrode. The conductive through via penetrates the dielectric layer and the third electrode to be connected to the first electrode and the second electrode, and is electrically separated from the third electrode. The first electrode and the second electrode are signal electrodes, and the third electrode is a ground electrode. The inductor is electrically connected to the capacitor. The inductor is connected to the first electrode and/or the second electrode.

The redistribution layer structure of an embodiment of the disclosure includes a circuit layer structure, a capacitor, and an inductor. The capacitor is disposed in the circuit layer structure and includes a first electrode, a second electrode, a third electrode, a dielectric layer, and a conductive through via. The second electrode is disposed above the first electrode. The third electrode is disposed between the first electrode and the second electrode. The dielectric layer is disposed between the first electrode and the third electrode and between the second electrode and the third electrode. The conductive through via penetrates the dielectric layer and the third electrode to be connected to the first electrode and the second electrode, and is electrically separated from the third electrode. The first electrode and the second electrode are signal electrodes, and the third electrode is a ground electrode. The inductor is disposed in the circuit layer structure and electrically connected to the capacitor. The inductor is connected to the first electrode and/or the second electrode.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
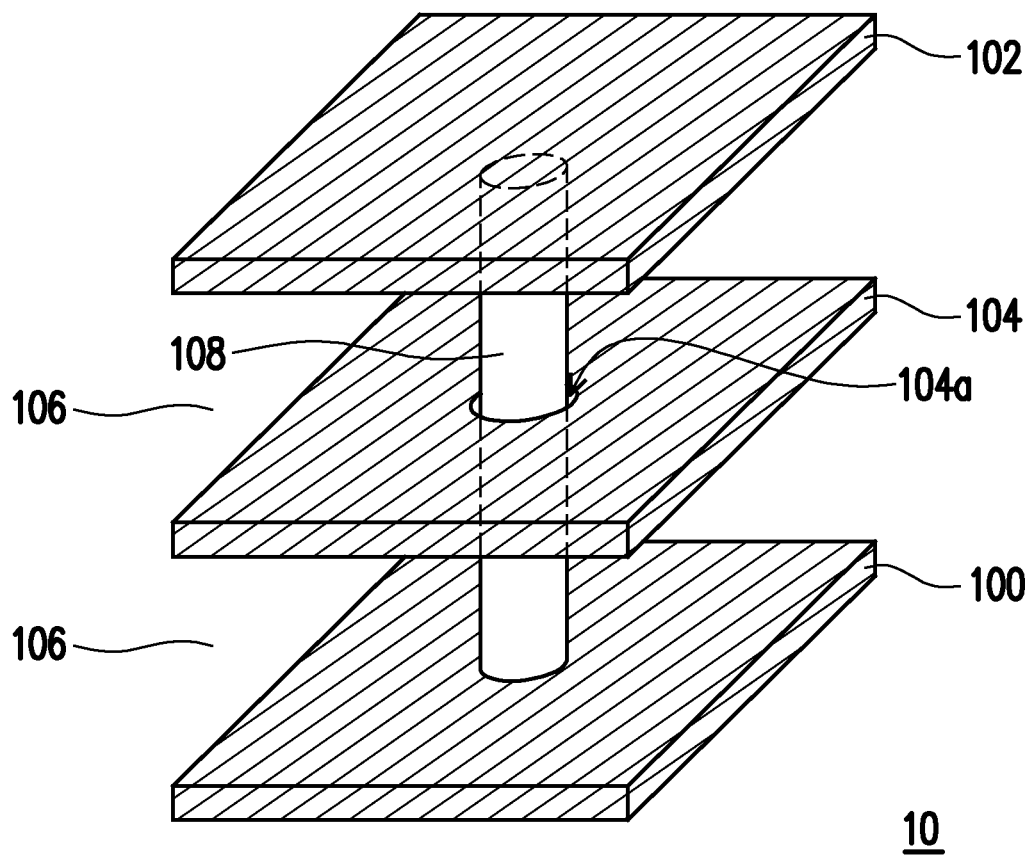
FIG. 1 is a three-dimensional diagram of a capacitor of the first embodiment of the disclosure.

Embodiments are provided hereinafter and described in detail with reference to figures. However, the embodiments provided are not intended to limit the scope of the disclosure. Moreover, the figures are descriptive and are not drawn to scale. For ease of explanation, the same elements below are provided with the same reference numerals.

Terms such as "contain", "include", and "have" used in the specification are all open terms, i.e., "contains, but not limited to".

In addition, the directional terms such as "upper" and "lower" mentioned in the specification are used to refer to the directions of the figures, but not to limit the disclosure.

When describing the components in terms of "first", "second", etc., the terms are used to distinguish the components from one another, and do not limit the order or importance of the components. Therefore, in some cases, the first component may also be called the second component, and the second component may also be called the first component, which does not deviate from the scope of the patent application.

FIG. 1 is a three-dimensional diagram of a capacitor shown according to the first embodiment of the disclosure.

Please refer to FIG. 1, a capacitor 10 of the present embodiment includes a first electrode 100, a second electrode 102, a third electrode 104, a dielectric layer 106, and a conductive through via 108. The capacitor 10 may be disposed on a commonly used substrate, such as a dielectric substrate or an insulating substrate, wherein the dielectric substrate may include a polyimide (PI) substrate, and the insulating substrate may be a polymer substrate or a ceramic substrate. In some embodiments, the substrate may be used as a carrier substrate. In some embodiments, the substrate may be a multi-layer ceramic (MLC) carrier board or a multi-layer organic (MLO) carrier board. In the present embodiment, in order to make the figures clear, the substrate is not illustrated. The first electrode 100 may be disposed on the substrate, the second electrode 102 is disposed above the first electrode 100, and the third electrode 104 is disposed between the first electrode 100 and the second electrode 102. In addition, the dielectric layer 106 is disposed between the first electrode 100 and the third electrode 104 and between the second electrode 102 and the third electrode 104. In the present embodiment, the material of the first electrode 100, the second electrode 102, and the third electrode 104 is, for example, a metal. The dielectric layer 106 may be a commonly used dielectric layer in the art, and is not repeated herein. In other words, the capacitor 10 of the present embodiment belongs to a metal-insulator-metal (MIM) capacitor.

In the present embodiment, the third electrode 104 has an opening 104a. The opening 104a penetrates the third electrode 104. In the present embodiment, the opening 104a is located at the center portion of the third electrode 104, but the disclosure is not limited thereto. The conductive through via 108 penetrates the opening 104a and the dielectric layer 106 located at the upper side and the lower side of the third electrode 104 to be connected to the first electrode 100 and the second electrode 102, so that the first electrode 100 and the second electrode 102 are electrically connected via the conductive through via 108. In addition, the conductive through via 108 penetrating the opening 104a is not in contact with the third electrode 104 and is electrically separated from the third electrode 104. In the present embodiment, the conductive through via 108 is not in contact with the third electrode 104, and the dielectric layer 106 is further located between the conductive through via 108 and the sidewall of the opening 104a, so that the conductive through via 108 may be electrically separated from the third electrode 104 via the dielectric layer 106, but the disclosure is not limited thereto. In other embodiments, the dielectric layer 106 may be omitted between the conductive through via 108 and the sidewall of the opening 104a. As long as the conductive through via 108 is not in contact with the third electrode 104, the object of electrical separation may be achieved.

In the present embodiment, the first electrode 100 and the second electrode 102 are electrically connected and may be electrically connected to an external signal source, so the first electrode 100 and the second electrode 102 may be referred to as signal electrodes. In addition, the third electrode 104 is not electrically connected to the signal source but is grounded, so the third electrode 104 may be referred to as a ground electrode. Therefore, in the present embodiment, the self-resonant frequency of the capacitor 10 may be increased.

Hereinafter, the capacitor 10 of the present embodiment and a common capacitive co-plane capacitor are used to illustrate the effects of the capacitor of an embodiment of the disclosure. The capacitive co-planar capacitor has one layer of a signal electrode and two layers of ground electrodes, and the signal electrode is disposed between the two layers of ground electrodes.

The capacitor 10 of the present embodiment and the capacitive co-planar capacitor are simulated and tested, and it is found that the capacitor 10 of the present embodiment may have a self-resonant frequency of up to about 6.7 GHz, which is significantly higher than the self-resonant frequency of the capacitive co-planar capacitor (about 3.6 GHz). In addition, compared to a capacitor having double-layer electrodes, the capacitive co-planar capacitor increases the self-resonant frequency by about 6%, and the capacitor 10 of the present embodiment may significantly increase the self-resonant frequency by about 97%. In addition, in terms of capacitance value variation, compared to the capacitor having double-layer electrodes (capacitance value variation of about 46.1%) and the capacitive co-planar capacitor (capacitance value variation of about 37.4%), the capacitor 10 of the present embodiment may have a relatively low capacitance value variation (about 7.06%). It may be seen that the capacitor 10 of the present embodiment has a high self-resonant frequency and good stability, so that the capacitance value is not readily deviated from the original design.

In addition, in the present embodiment, on a horizontal imaginary plane (such as the substrate surface), the projected area of the third electrode 104 is substantially the same as the projected area of the first electrode 100 and the projected area of the second electrode 102. That is, the first electrode 100, the second electrode 102, and the third electrode 104 have substantially the same size, but the disclosure is not limited thereto. In other embodiments, on the horizontal imaginary plane, the projected area of the third electrode 104 may be greater than the projected area of the first electrode 100 and the projected area of the second electrode 102, which is described in detail below.

Figure 2:
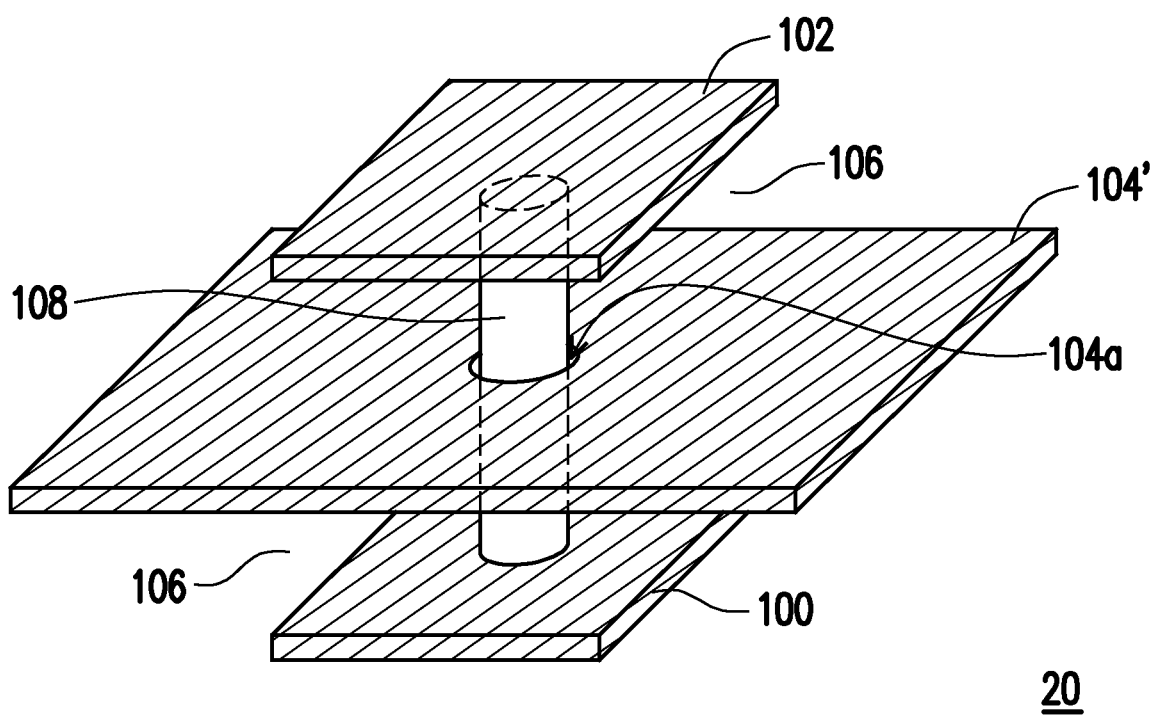
FIG. 2 is a three-dimensional diagram of a capacitor of the second embodiment of the disclosure.

FIG. 2 is a three-dimensional diagram of a capacitor of the second embodiment of the disclosure. Referring to FIG. 2, in a capacitor 20 of the second embodiment, on a horizontal imaginary plane, the projected area of a third electrode 104' is greater than the projected area of the first electrode 100 and the projected area of the second electrode 102. That is, the size of the third electrode 104' is greater than the size of the first electrode 100 and the size of the second electrode 102. In this way, the self-resonant frequency and the stability of the capacitor may be improved more effectively.

In addition, in the present embodiment, one layer of the third electrode is provided as the ground electrode, but the disclosure is not limited thereto. In other embodiments, a multilayer electrode may be used as the ground electrode, which is described in detail below.

Figure 3:
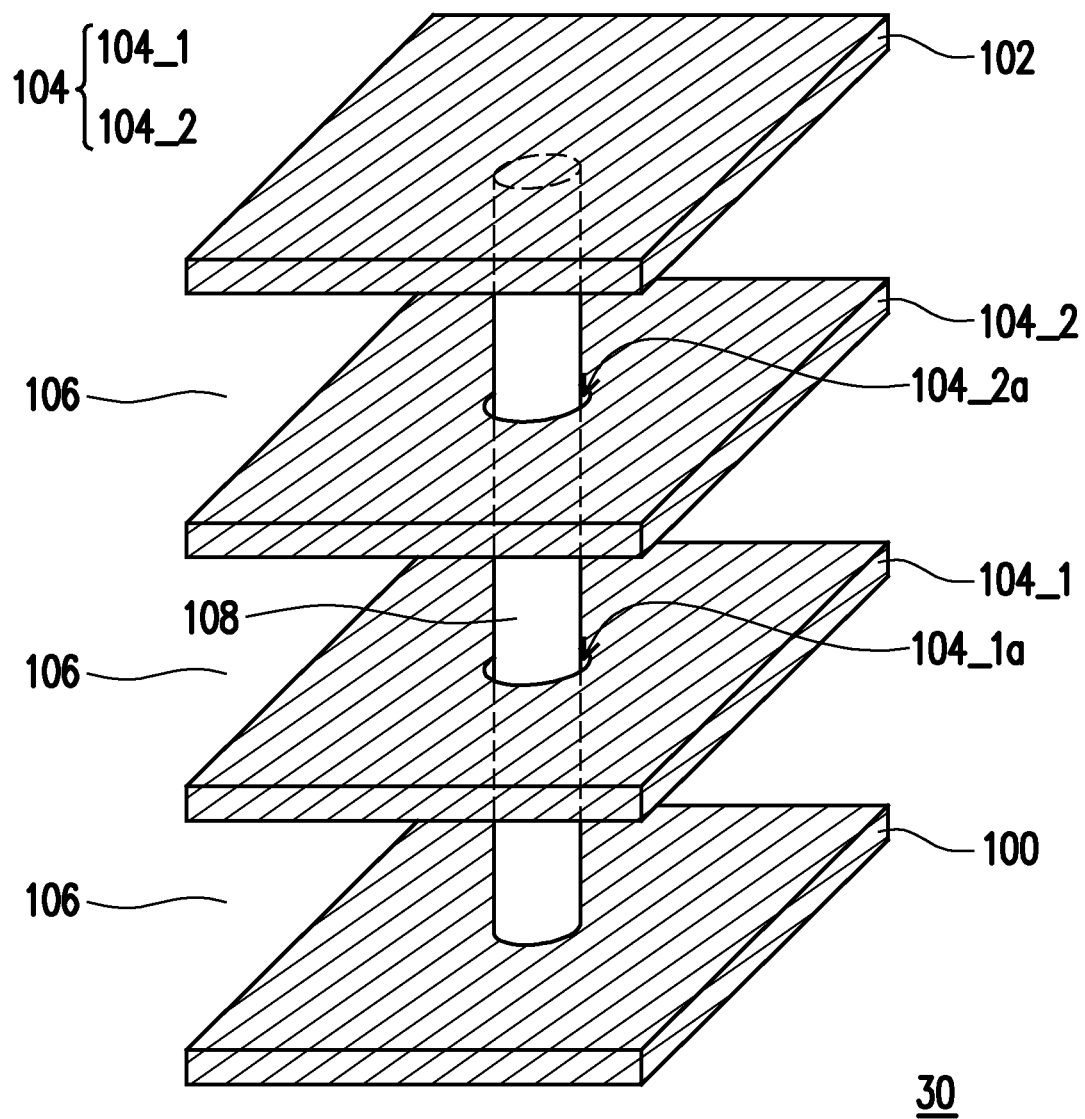
FIG. 3 is a three-dimensional diagram of a capacitor of the third embodiment of the disclosure.

FIG. 3 is a three-dimensional diagram of a capacitor of the third embodiment of the disclosure. Referring to FIG. 3, in a capacitor 30 of the third embodiment, the third electrode 104 includes two electrode plates 104_1 and 104_2 separated from each other. The electrode plate 104_2 is located above the electrode plate 104_1, and the dielectric layer 106 is located between the adjacent electrode plate 104_1 and electrode plate 104_2. In addition, the electrode plate 104_1 has an opening 104_1a, the electrode plate 104_2 has an opening 104_2a, and the opening 104_1a and the opening 104_2a are aligned with each other. The conductive through via 108 penetrates the opening 104_1a, the opening 104_2a, the dielectric layer 106 located on the upper side of the electrode plate 104_1, the dielectric layer 106 located on the lower side of the electrode plate 104_2, and the dielectric layer 106 between the electrode plate 104_1 and the electrode plate 104_2 to be connected to the first electrode 100 and the second electrode 102, so that the first electrode 100 and the second electrode 102 are electrically connected via the conductive through via 108. In addition, the conductive through via 108 penetrating the opening 104_1a and the opening 104_2a is not in contact with the electrode plate 104_1 and the electrode plate 104_2, and is electrically separated from the electrode plate 104_1 and the electrode plate 104_2. In the present embodiment, the conductive through via 108 is not in contact with the electrode plate 104_1 and the electrode plate 104_2, and the dielectric layer 106 is further located between the conductive through via 108 and the sidewall of the opening 104_1a and between the conductive through via 108 and the sidewall of the opening 104_2a. Therefore, the conductive through via 108 may be electrically separated from the electrode plate 104_1 and the electrode plate 104_2 via the dielectric layer 106, but the disclosure is not limited thereto. In other embodiments, the dielectric layer 106 may also be omitted between the conductive through via 108 and the sidewall of the opening 104_1a and between the conductive through via 108 and the sidewall of the opening 104_2a. As long as the conductive through via 108 is not in contact with the electrode plate 104_1 and the electrode plate 104_2, the object of electrical separation may be achieved.

In the present embodiment, the third electrode 104 includes the two electrode plates 104_1 and 104_2 separated from each other, but the disclosure is not limited thereto. In other embodiments, the third electrode 104 may include more electrode plates separated from one another, and the conductive through via 108 penetrates the dielectric layer 106 and the electrode plates to be connected to the first electrode 100 and the second electrode 102. In addition, in other embodiments, like the second embodiment, on a horizontal imaginary plane, the projected area of the electrode plate 104_1 and/or the electrode plate 104_2 may be greater than the projected area of the first electrode 100 and the projected area of the second electrode 102. That is, the size of the electrode plate 104_1 and/or the electrode plate 104_2 may be greater than the size of the first electrode 100 and the size of the second electrode 102. In this way, the self-resonant frequency and the stability of the capacitor may be improved more effectively.

When a dielectric layer having a high dielectric constant (dielectric constant greater than about 4) is used as the dielectric layer in the capacitor of an embodiment of the disclosure, the self-resonant frequency of the capacitor may be further increased. After the simulation test, it may be known that under the design of the same capacitance value, increasing the dielectric constant of the dielectric layer may further increase the self-resonant frequency of the capacitor. In other words, under the same self-resonant frequency, the area of the signal electrodes may be reduced. For example, when the dielectric constant of the dielectric layer in the capacitor of an embodiment of the disclosure is increased from 6.5 to 50, the self-resonant frequency of the capacitor may be significantly increased. In addition, with the same self-resonant frequency, the area of the signal electrodes may be reduced by about 87%.

In addition, based on actual need, a plurality of the capacitor of an embodiment of the disclosure may be disposed on the substrate by stacking, and the capacitors share signal electrodes with one another. For example, a plurality of capacitors 10 may be disposed on the substrate by stacking, and the second electrode 102 (upper electrode) of the capacitor 10 located below may simultaneously be used as the first electrode 100 (lower electrode) of the capacitor 10 located above.

Since the capacitor of an embodiment of the disclosure has a high self-resonant frequency and good stability, the capacitor of an embodiment of the disclosure may be applied in DC blocking at UHF, a bias network, a filter, a matching network, a voltage-controlled oscillator (VCO), a power amplifier, and the like. The following uses a filter as an example for description.

Figure 4:
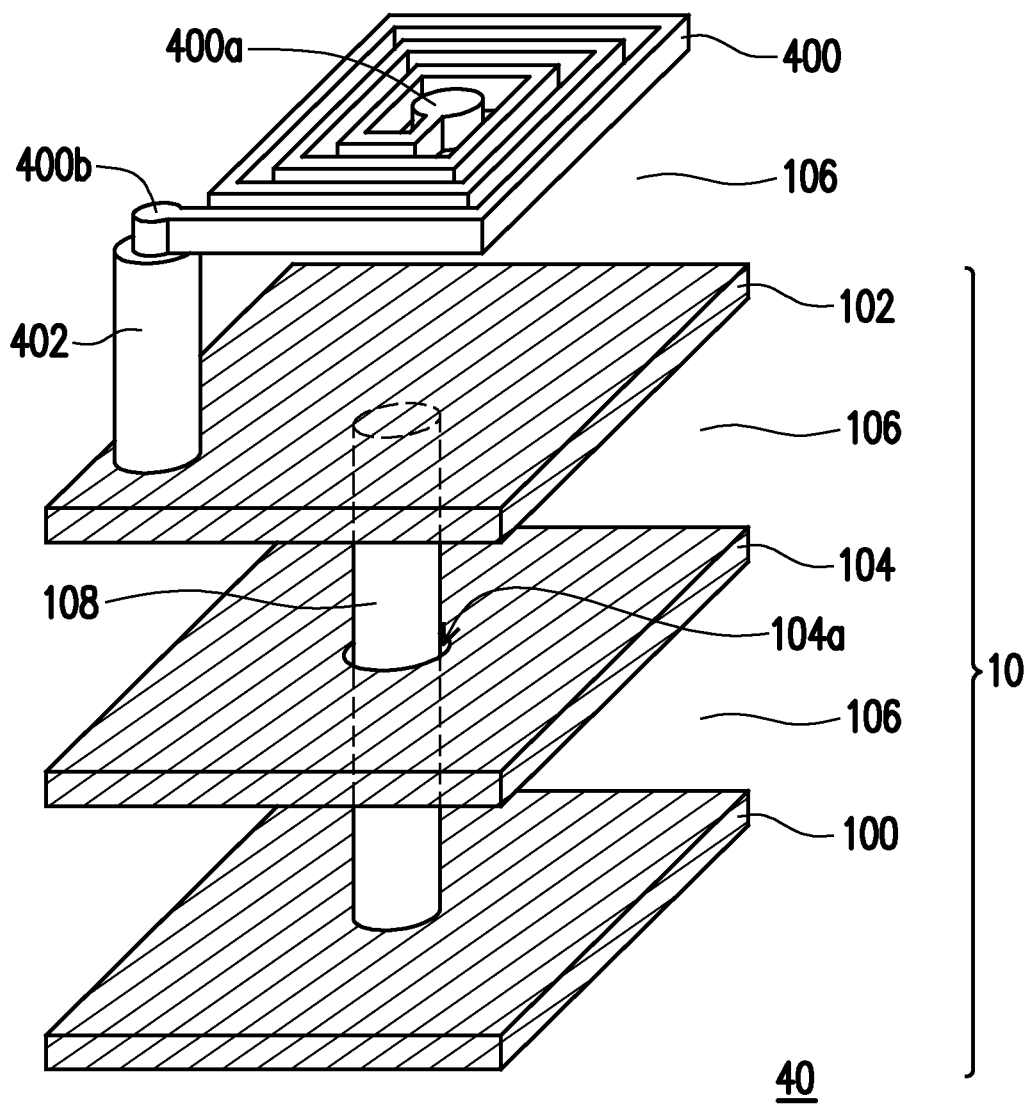
FIG. 4 is a three-dimensional diagram of a filter of an embodiment of the disclosure.

FIG. 4 is a three-dimensional diagram of a filter according to an embodiment of the disclosure. Referring to FIG. 4, a filter 40 of the present embodiment includes an inductor 400 and a capacitor of an embodiment of the disclosure. Therefore, the filter 40 is an LC filter. In the present embodiment, the capacitor 10 is used as an example. In other embodiments, the capacitor 10 may be replaced with the capacitor 20, the capacitor 30, or other types of capacitors in an embodiment of the disclosure. The inductor 400 may be various types of commonly known inductors, and the disclosure is not limited in this regard. The inductor 400 is disposed above the capacitor 10, and the dielectric layer 106 is located between the inductor 400 and the capacitor 10 to separate the inductor 400 from the capacitor 10. Moreover, a conductive through via 402 penetrates the dielectric layer 106 between the inductor 400 and the capacitor 10 to be connected to the inductor 400 and the second electrode 102 of the capacitor 10 so that the inductor 400 and the capacitor 10 are electrically connected. In the present embodiment, one end 400b of the inductor 400 is connected to a conductive through via 402, and the other end 400a thereof may be connected to an external element (not shown), but the disclosure is not limited thereto. In other embodiments, the inductor 400 may be connected to the first electrode 100 of the capacitor 10 via a conductive through via, or connected to the first electrode 100 and the second electrode 102 of the capacitor 10 at the same time, so that the inductor 400 and the capacitor 10 are electrically connected.

In the present embodiment, the inductor 400 is disposed above the capacitor 10, but the disclosure is not limited thereto. In other embodiments, based on actual need, the inductor 400 may also be disposed below the capacitor 10, and the inductor 400 and the first electrode 100 of the capacitor 10 may be connected via a conductive through via, so that the inductor 400 and the capacitor 10 are electrically connected. Alternatively, the inductor 400 and the capacitor 10 may be disposed at the same horizontal height, and one end of the inductor 400 and the first electrode 100 or the second electrode 102 of the capacitor 10 belong to the same conductive pattern layer.

In addition, in other embodiments, based on actual need, a plurality of inductors may be stacked, and the inductors are electrically connected to one another. For example, under the same filter electrical design, the inductor design is adjusted from a single-layer arrangement to a multi-layer stack, and the three-dimensional stacking space is used to reduce the circuit layout area.

In the present embodiment, the filter 40 includes the capacitor of an embodiment of the disclosure. Since the capacitor of an embodiment of the disclosure has a high self-resonant frequency and good stability, influence from the self-resonant frequency effect is negligible when the filter 40 is operated at a high frequency. Therefore, the filter 40 may have good stability and performance.

A redistribution layer structure including the capacitor of an embodiment of the disclosure is described below in conjunction with the above embodiments, especially for a redistribution layer structure of a filter provided with the capacitor of an embodiment of the disclosure. However, the disclosure is not limited thereto.

Figure 5:
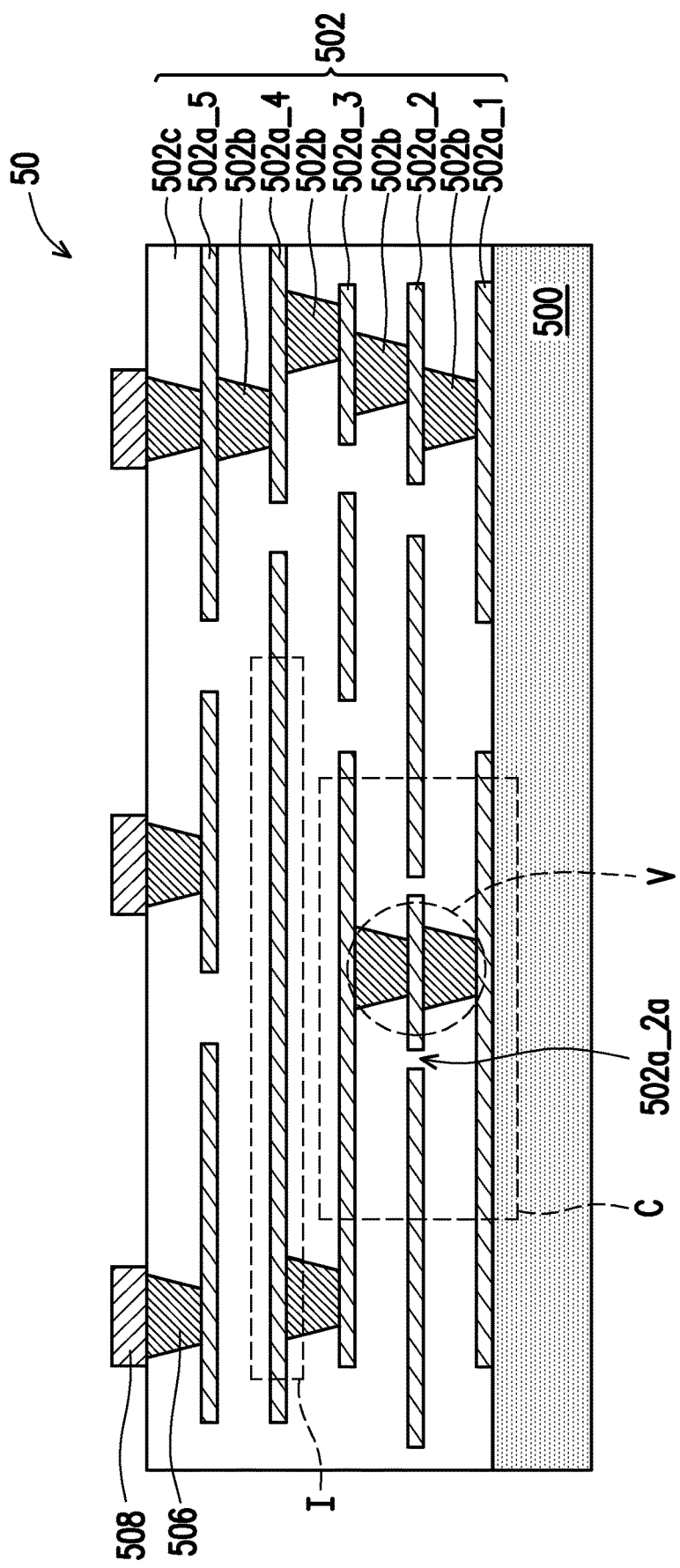
FIG. 5 is a cross-sectional view of a redistribution layer structure of an embodiment of the disclosure.

FIG. 5 is a cross-sectional view of a redistribution layer structure of an embodiment of the disclosure. Referring to FIG. 5, a redistribution layer structure 50 of the present embodiment includes a circuit layer structure 502, a capacitor C, and an inductor I. In the present embodiment, the circuit layer structure 502 is disposed on a substrate 500. The substrate 500 may be a dielectric substrate or an insulating substrate, wherein the dielectric substrate is, for example, a polyimide substrate, and the insulating substrate may be a polymer substrate or a ceramic substrate. In some embodiments, the substrate may be a multi-layer ceramic (MLC) carrier board or a multi-layer organic (MLO) carrier board. In some embodiments, the substrate 500 may be used as a carrier substrate to carry members such as the circuit layer structure 502, the capacitor C, and the inductor I. In addition, in some embodiments, the redistribution layer structure 50 may not be disposed on the substrate 500 based on actual need.

The circuit layer structure 502 includes a plurality of circuit layers, conductive through vias for electrically connecting the circuit layers, and an insulating layer. In the present embodiment, the circuit layer structure 502 includes 5 circuit layers (a circuit layer 502a_1, a circuit layer 502a_2, a circuit layer 502a_3, a circuit layer 502a_4, and a circuit layer 502a_5), conductive through vias 502b for electrically connecting the circuit layers, and an insulating layer 502c. The circuit layer 502a_1, the circuit layer 502a_2, the circuit layer 502a_3, the circuit layer 502a_4, the circuit layer 502a_5, and the conductive through vias 502b are disposed in the insulating layer 502c. The circuit layer 502a_1, the circuit layer 502a_2, the circuit layer 502a_3, the circuit layer 502a_4, and the circuit layer 502a_5 are separated from one another by the insulating layer 502c. The conductive through vias 502b are connected to two adjacent circuit layers. In the present embodiment, the circuit layer structure 502 includes 5 circuit layers, but the disclosure is not limited thereto. In other embodiments, the circuit layer structure may include more circuit layers based on actual need. In addition, the disclosure does not limit the layout of the circuit layer structure and the material of each member. In the present embodiment, a pad 508 connected to a conductive through via 506 located in the insulating layer 502c is disposed on the surface of the circuit layer structure 502.

The capacitor C and the inductor I are disposed in the circuit layer structure 502. In the present embodiment, the inductor I is located above the capacitor C, and the capacitor C and the inductor I are electrically connected to form a filter. In other embodiments, the inductor I may be located below the capacitor C, or the inductor I and the capacitor C may be located at the same horizontal height. The capacitor C is the capacitor of an embodiment of the disclosure (may be the capacitor 10, the capacitor 20, or the capacitor 30 in the above embodiments), and the inductor I may be an inductor commonly used in the art. In the present embodiment, the capacitor C and the inductor I are integrated in the circuit layer structure 502. That is, the circuit layer of the circuit layer structure 502 is used as the electrode of the capacitor C and the circuit pattern of the inductor I, and the dielectric layer of the circuit layer structure 502 is used as the dielectric layer of the capacitor C. Details are provided below.

As shown in FIG. 5, in the circuit layer structure 502, a portion of the first circuit layer 502a_1 may be used as a signal electrode of the capacitor C (for example, the first electrode 100 in the capacitor 10), a portion of the second circuit layer 502a_2 may be used as the ground electrode of the capacitor C (for example, the third electrode 104 in the capacitor 10), and a portion of the third circuit layer 502a_3 may be used as another signal electrode of the capacitor C (for example, the second electrode 102 in the capacitor 10). In addition, the second circuit layer 502a_2 used as the ground electrode of the capacitor C has an opening 502a_2a, and the conductive through vias 502b located in the opening 502a_2a forms a conductive through via V of the capacitor C (for example, the conductive through via 108 in the capacitor 10). The conductive through via V is electrically connected to the signal electrode of the upper layer and the signal electrode of the lower layer, and is not in contact with the ground electrode of the capacitor C (the second circuit layer 502a_2 outside the opening 502a_2a).

In addition, in the circuit layer structure 502, a portion of the fourth circuit layer 502a_4 may be used as the inductor I. The inductor I is electrically connected to the signal electrodes of the capacitor C via the conductive through via 502b. In this way, the inductor I and the capacitor C form an LC filter. In the present embodiment, since the capacitor C and the inductor I are integrated in the circuit layer structure 502, the layout area occupied by the capacitor C and the inductor I may be effectively reduced, thereby reducing the size of the redistribution layer structure.

In the present embodiment, the circuit layer structure 502 includes 5 circuit layers, the capacitor C is integrated in the first to third circuit layers, and the inductor I is integrated in the fourth circuit layer, but the disclosure is not limited thereto. In an embodiment in which the circuit layer structure 502 has more circuit layers, the capacitor C and the inductor I may be integrated in other positions in the circuit layer structure 502 based on actual need.

In addition, when the dielectric layer of the capacitor C is a high-k layer, the insulating layer 502c in the circuit layer structure 502 may be a high-k layer at the same time, so that the capacitor C may be more completely integrated in the circuit layer structure 502.

In addition, in the redistribution layer structure 50 of the present embodiment, a portion of the circuit layer in the circuit layer structure 502 may be used as a guard ring. The guard ring is used to prevent the elements in the redistribution layer structure 50 from being interfered by an external signal. Therefore, in the present embodiment, the layout area of the capacitor is located in the area surrounded by the guard ring.

Figure 6:
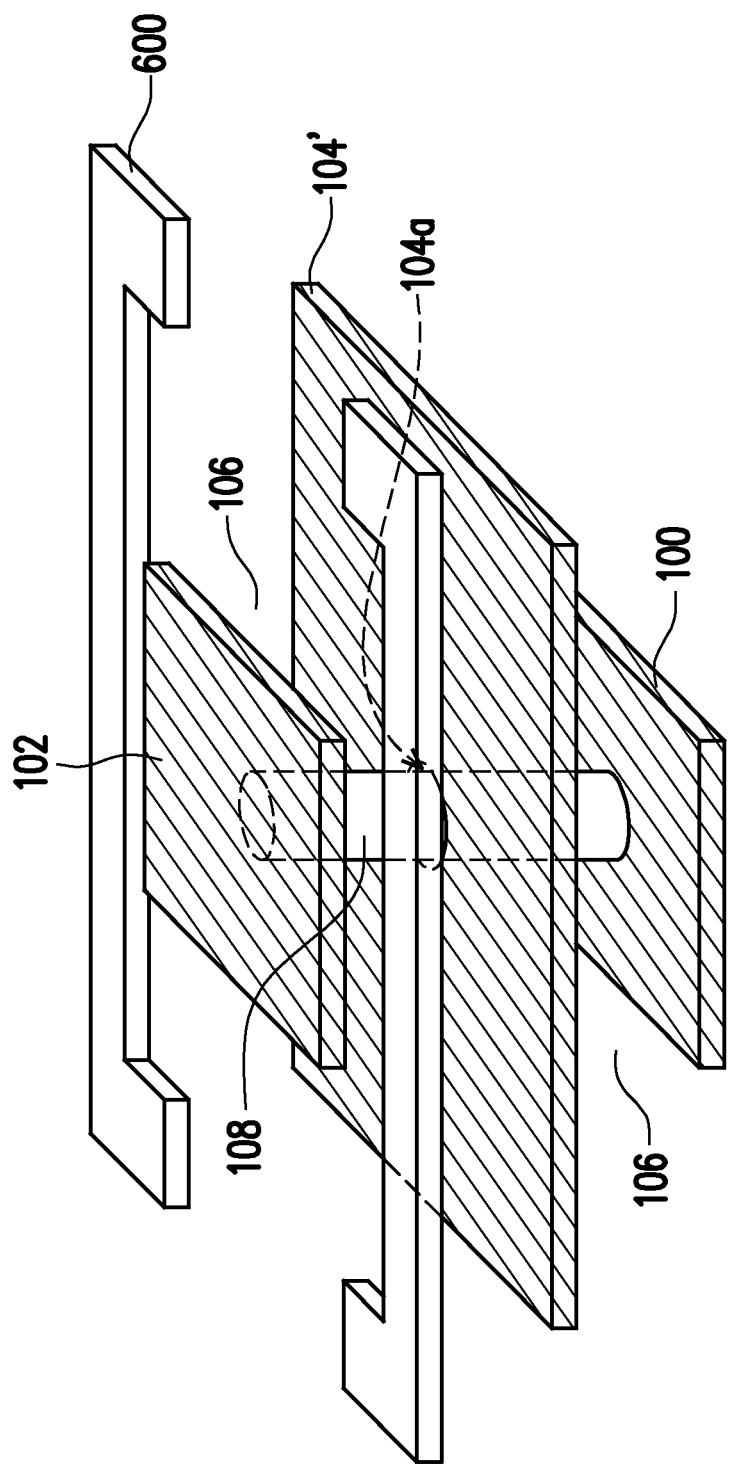
FIG. 6 is a three-dimensional diagram of the capacitor and the guard ring in FIG. 5.

For example, as shown in FIG. 6, in the circuit layer structure 502, the same circuit layer may be used as the second electrode 102 of the capacitor 20 and a guard ring 600, and the layout area of the capacitor is located in the area surrounded by the guard ring 600. In other words, the first electrode 100, the second electrode 102, and the third electrode 104' are all located in the area surrounded by the guard ring 600. In this case, on a horizontal imaginary plane, the projected area of the third electrode 104' is greater than the projected area of the first electrode 100 and the projected area of the second electrode 102, and the layout area of the third electrode 104' is less than the area surrounded by the guard ring 600.

In the present embodiment, the guard ring 600 has a discontinuous ring pattern, but the disclosure is not limited thereto. In other embodiments, the guard ring 600 may have a closed ring pattern.

In addition, for the filter, the surrounding circuit layer may also be used as a guard ring to prevent the inductor from being interfered by an external signal.

The redistribution layer structure 50 of the present embodiment may be applied to a general semiconductor package structure, which is described below.

Figure 7:
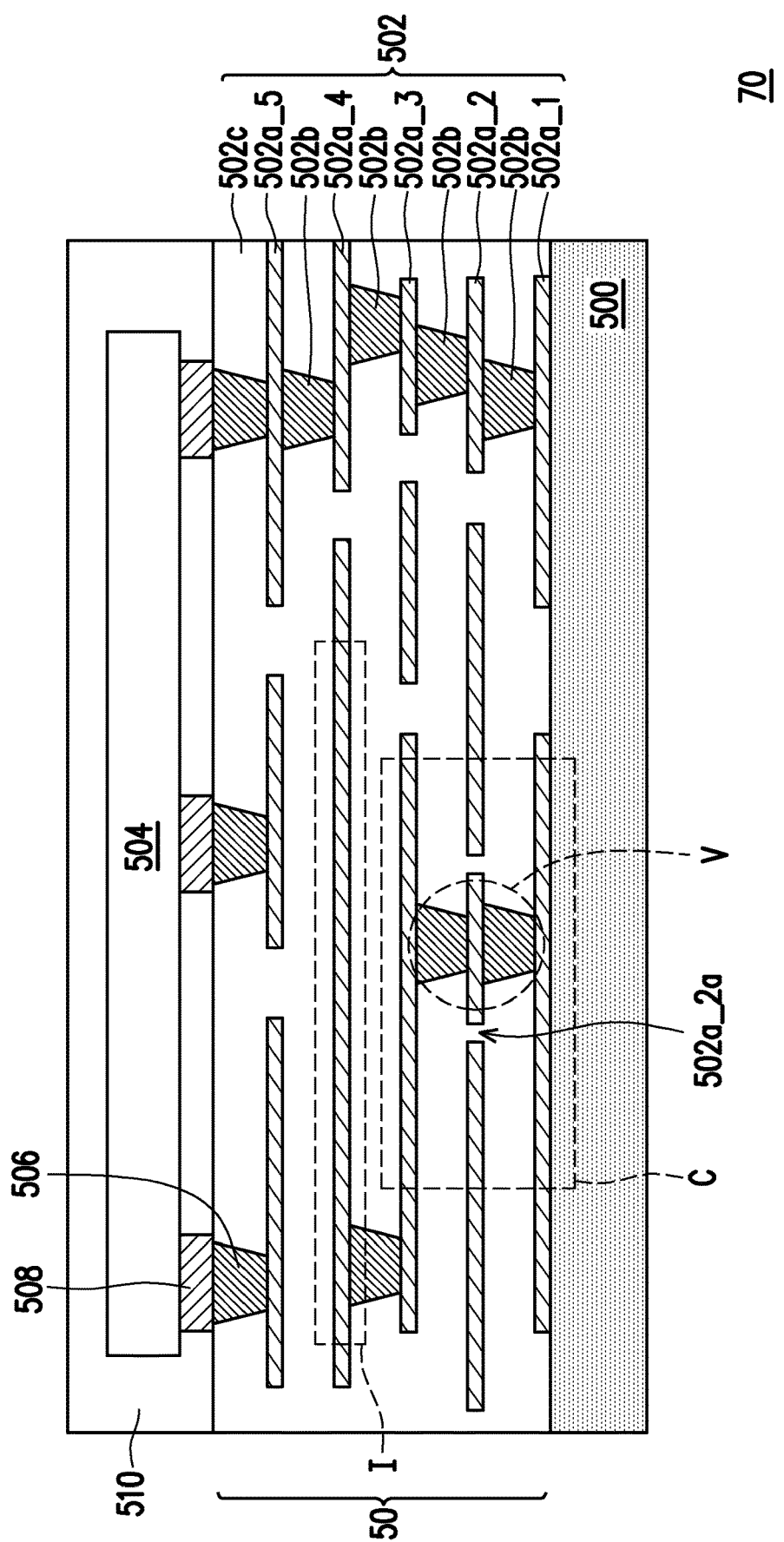
FIG. 7 is a cross-sectional view of a semiconductor package structure of an embodiment of the disclosure.

FIG. 7 is a cross-sectional view of a semiconductor package structure of an embodiment of the disclosure. Please refer to FIG. 7, a semiconductor package structure 70 of the present embodiment includes the redistribution layer structure 50 disposed on the substrate 500, a chip 504, and an encapsulation body 510. The chip 504 is disposed above the circuit layer structure 502 and electrically connected to the circuit layer structure 502. In the present embodiment, the chip 504 is connected to the uppermost circuit layer 502a_5 in the circuit layer structure 502 via the conductive through via 506 disposed in the insulating layer 502c and the pad 508 disposed on the surface of the circuit layer structure 502 and connected to the conductive through via 506, so as to be electrically connected to the circuit layer structure 502. The chip 504 may be connected to the pad 508 via a pad (not shown) disposed on the active surface thereof. However, in other embodiments, the chip 504 may be electrically connected to the circuit layer structure 502 in any other well-known manner, and the disclosure is not limited in this regard. The chip 504 may be various well-known chips, such as a memory chip, a control chip, etc., and the disclosure is not limited in this regard. In addition, the encapsulation body 510 is disposed on the surface of the circuit layer structure 502 and covers the chip 504 to prevent the chip 504 from being damaged.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A filter, comprising:
    a capacitor, comprising:
        a first electrode;
        a second electrode disposed above the first electrode;
        a third electrode disposed between the first electrode and the second electrode;
        a plurality of dielectric layers disposed between the first electrode and the third electrode and between the second electrode and the third electrode; and
        a conductive through via penetrating the dielectric layer and the third electrode to be connected to the first electrode and the second electrode, and electrically separated from the third electrode; and
    an inductor electrically connected to the capacitor,
    wherein the first electrode and the second electrode are signal electrodes, the third electrode is a ground electrode, and the inductor is connected to the first electrode and/or the second electrode, and
    the first electrode and the second electrode are the outermost electrodes in the capacitor.

2. The filter of claim 1, wherein the third electrode has an opening, the conductive through via penetrates the opening, and one of the dielectric layers is further located between the conductive through via and a sidewall of the opening.

3. The filter of claim 1, wherein each of the dielectric layers is a high-k layer, and a dielectric constant of the high-k layer is greater than 4.

4. The filter of claim 1, wherein on a horizontal imaginary plane, a projected area of the third electrode is not less than a projected area of the first electrode, and not less than a projected area of the second electrode.

5. The filter of claim 1, wherein the third electrode comprises a plurality of electrode plates separated from one another, one of the dielectric layers is located between adjacent electrode plates, and the conductive through via penetrates the one of the dielectric layers and the plurality of electrode plates to be connected to the first electrode and the second electrode, and is electrically separated from the plurality of electrode plates.

6. The filter of claim 5, wherein each of the plurality of electrode plates has an opening, the conductive through via penetrates the opening, and the one of the dielectric layers is further located between the conductive through via and a sidewall of the opening.

7. A redistribution layer structure, comprising:
    a circuit layer structure;
    a capacitor disposed in the circuit layer structure and comprising:
        a first electrode;
        a second electrode disposed above the first electrode;
        a third electrode disposed between the first electrode and the second electrode;
        a plurality of dielectric layers disposed between the first electrode and the third electrode and between the second electrode and the third electrode; and
        a conductive through via penetrating the dielectric layer and the third electrode to be connected to the first electrode and the second electrode, and electrically separated from the third electrode; and
    an inductor disposed in the circuit layer structure and electrically connected to the capacitor,
    wherein the first electrode and the second electrode are signal electrodes, the third electrode is a ground electrode, and the inductor is connected to the first electrode and/or the second electrode, and
    the first electrode and the second electrode are outermost electrodes in the capacitor.

8. The redistribution layer structure of claim 7, wherein the third electrode has an opening, the conductive through via penetrates the opening, and one of the dielectric layers is further located between the conductive through via and a sidewall of the opening.

9. The redistribution layer structure of claim 7, wherein each of the dielectric layers is a high-k layer, and a dielectric constant of the high-k layer is greater than 4.

10. The redistribution layer structure of claim 7, wherein on a horizontal imaginary plane, a projected area of the third electrode is not less than a projected area of the first electrode, and not less than a projected area of the second electrode.

11. The redistribution layer structure of claim 7, wherein the third electrode comprises a plurality of electrode plates separated from one another, one of the dielectric layers is located between adjacent electrode plates, and the conductive through via penetrates the dielectric layer and the plurality of electrode plates to be connected to the first electrode and the second electrode, and is electrically separated from the plurality of electrode plates.

12. The redistribution layer structure of claim 7, wherein a portion of a circuit layer in the circuit layer structure is used as the inductor and the first electrode, the second electrode, and the third electrode of the capacitor, respectively, and a dielectric layer in the circuit layer structure is used as the dielectric layers of the capacitor.

13. The redistribution layer structure of claim 10, wherein a portion of a circuit layer in the circuit layer structure is used as a guard ring, and a layout area of the third electrode is in an area surrounded by the guard ring.

14. The redistribution layer structure of claim 11, wherein each of the plurality of electrode plates has an opening, the conductive through via penetrates the opening, and the one of the dielectric layers is further located between the conductive through via and a sidewall of the opening.

* * * * *